United States Patent [19]
Yu et al.

[11] Patent Number: 6,025,259
[45] Date of Patent: Feb. 15, 2000

[54] DUAL DAMASCENE PROCESS USING HIGH SELECTIVITY BOUNDARY LAYERS

[75] Inventors: Allen S. Yu, Fremont; Paul J. Steffan, Elk Grove; Thomas Charles Scholer, San Jose, all of Calif.

[73] Assignee: Advanced Micro Devices, Inc., Sunnyvale, Calif.

[21] Appl. No.: 09/109,113

[22] Filed: Jul. 2, 1998

[51] Int. Cl.$^7$ ............................................. H01L 21/4763
[52] U.S. Cl. ..................... 438/618; 438/624; 438/626; 438/629; 438/634; 438/637; 438/638; 438/666; 438/667; 438/668; 438/669; 438/672; 438/675
[58] Field of Search ................................. 438/618, 624, 438/626, 629, 634, 637, 638, 666, 667, 668, 669, 672, 675

[56] References Cited

U.S. PATENT DOCUMENTS

| | | | |
|---|---|---|---|
| 5,371,047 | 12/1994 | Greco et al. | 437/238 |
| 5,578,523 | 11/1996 | Fiordalice et al. | 437/190 |
| 5,635,423 | 6/1997 | Huang et al. | 437/195 |
| 5,741,626 | 4/1998 | Jain et al. | 430/314 |
| 5,759,911 | 6/1998 | Cronin et al. | 438/622 |
| 5,877,075 | 3/1999 | Dai et al. | 438/597 |
| 5,877,076 | 3/1999 | Dai | 438/597 |
| 5,882,996 | 3/1999 | Dai | 438/597 |
| 5,904,565 | 5/1999 | Nguyen et al. | 438/687 |

*Primary Examiner*—Jey Tsai
*Assistant Examiner*—Lynne A Gurley
*Attorney, Agent, or Firm*—H. Donald Nelson

[57] ABSTRACT

A method of manufacturing a semiconductor device with multiple dual damascene structures that maintains the maximum density. A first dual damascene structure having a first via and a first trench is formed in a first interlayer dielectric and a first etch stop layer formed on the planarized surface of the first interlayer dielectric. Two layers of interlayer dielectric separated by a second etch stop layer is formed on the surface of the first etch stop layer. A third etch stop layer is formed on the upper layer of interlayer dielectric and a first photoresist layer formed on the third etch stop layer. The photoresist layer is etched having a dimension coinciding with a width dimension of the first via. The third etch stop layer is selectively etched and the first photoresist layer removed and replaced by a second photoresist layer. The second photoresist layer is etched having a dimension coinciding with a width dimension of the first trench. The two layers of interlayer dielectric and the first, second and third etch stop layers are etched to form a second dual damascene structure having a second via and a second trench having the same dimensions as the first dual damascene structure.

5 Claims, 12 Drawing Sheets

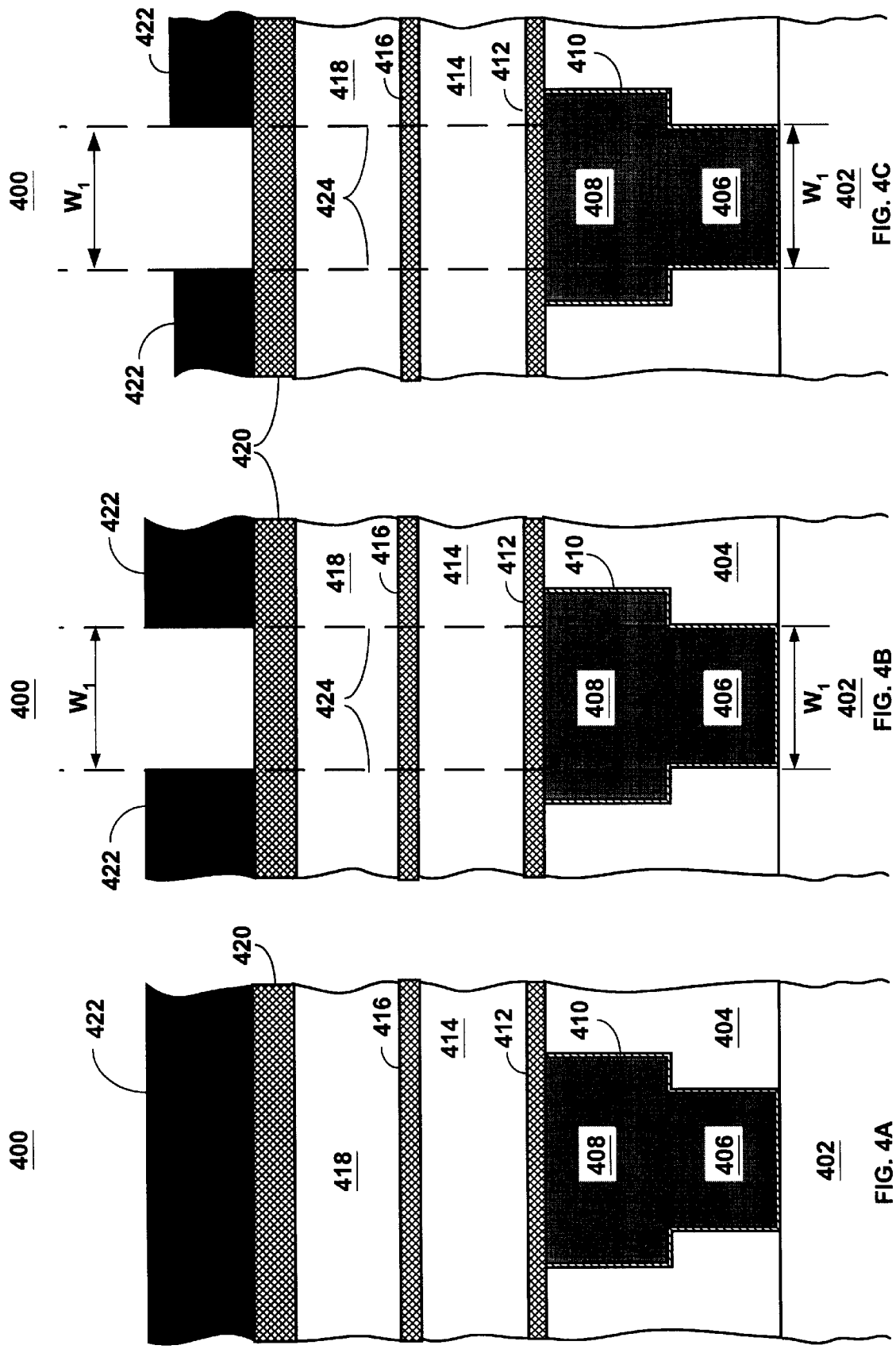

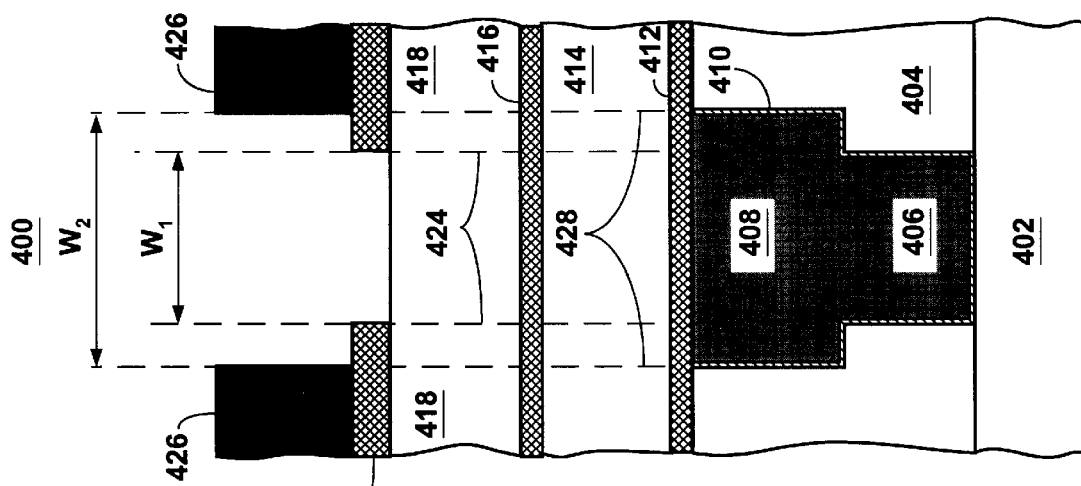
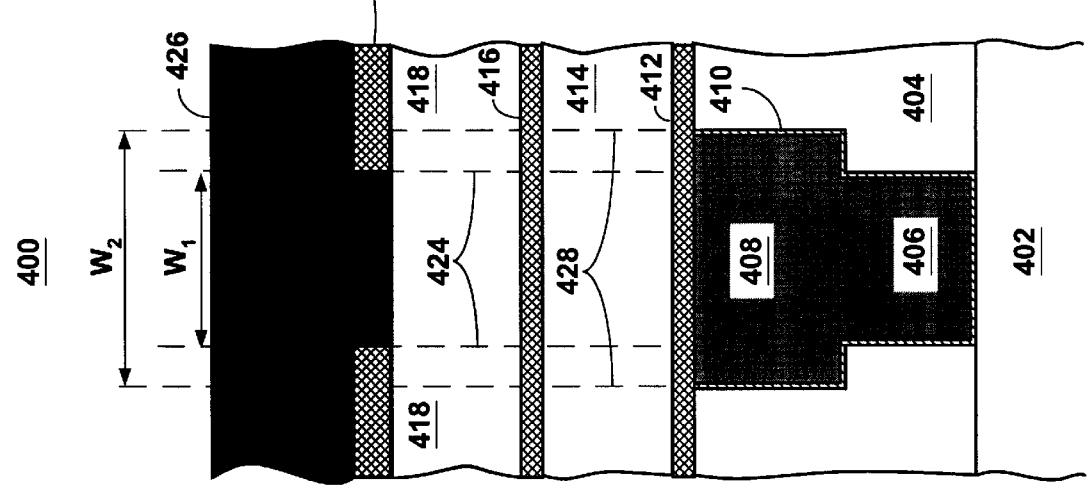
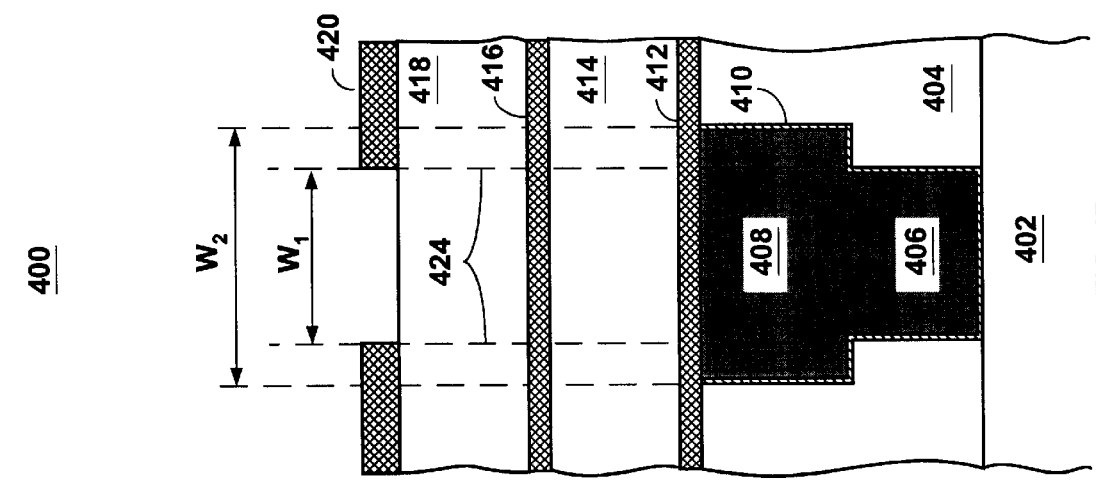

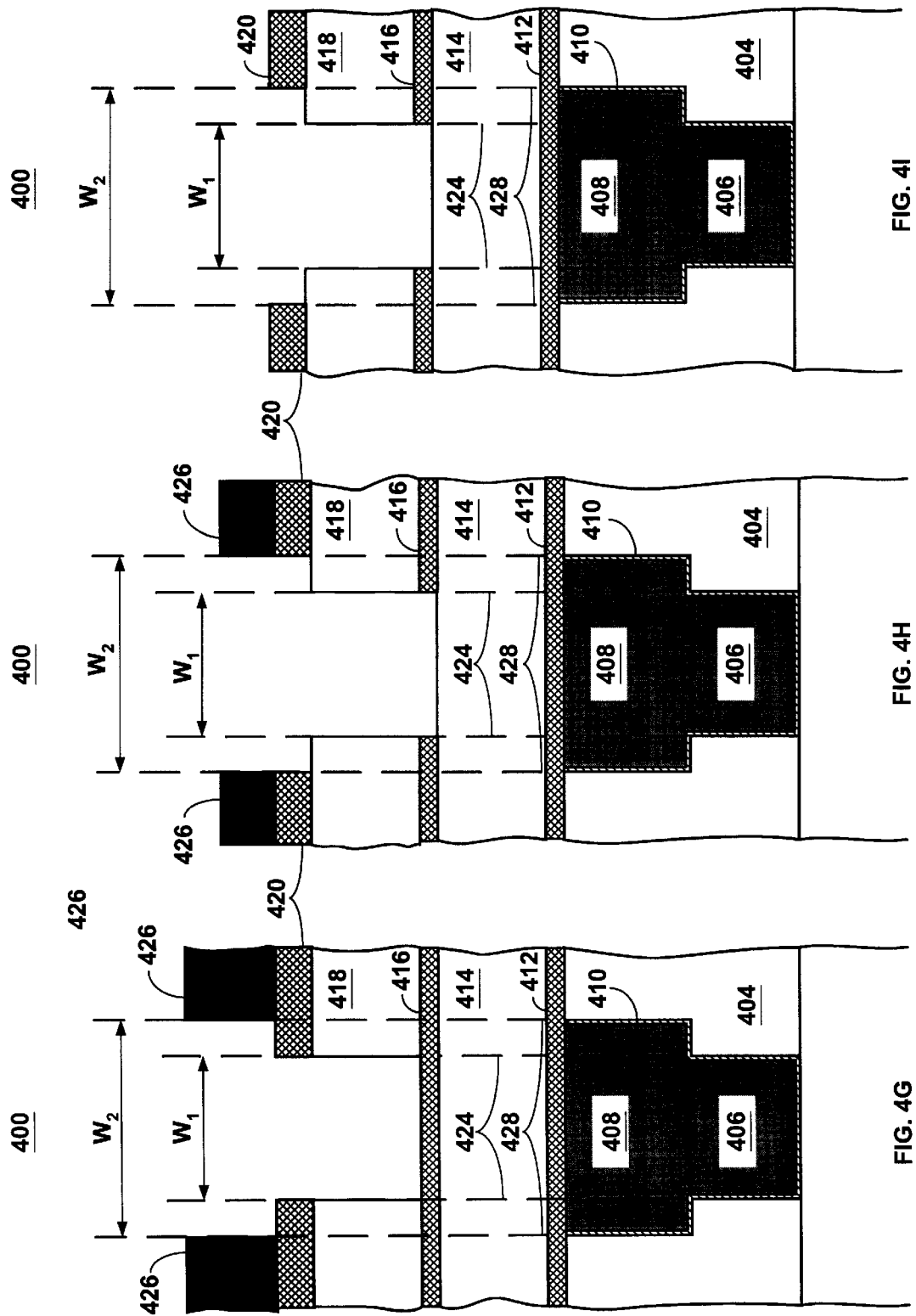

DUAL DAMASCENE PROCESS USING HIGH SELECTIVITY BOUNDARY LAYERS

BACKGROUND OF THE INVENTION

1. Field of the Invention

This invention relates generally to a method of manufacturing high density, high performance semiconductor devices that have dual damascene interconnects. More specifically, this invention relates to a method of manufacturing high density, high performance semiconductor devices that have dual damascene interconnects that have the minimum pitch and that have the maximum contact area at the electrical interconnections.

2. Discussion of the Related Art

The increased demand for higher performance semiconductor devices has required the density of metallization lines to be increased and in addition has required the addition of stacked layers. These requirements have necessitated the development of novel approaches in the methods of forming interconnections that not only integrate fine geometry definition but are also conducive to subsequent CMP (chemical mechanical polishing) processing. As the interconnection line widths shrink, the challenges of etching materials using photoresist-as-mask techniques have become increasingly difficult. A major cause of the difficulty is the large aspect ratios involved. The aspect ratio is the ratio of the depth of a feature being etched to the width of the feature (D/W).

One method of forming a trench is a method known as the damascene process, which comprises forming a trench by masking and etching techniques and subsequent filling of the trench with the desired conductive material. The damascene process is a useful method for attaining the fine geometry metallization required for advanced semiconductor devices. A dual damascene process is a two step sequential mask/etch process to form a two level structure such as a via connected to a metal line above the via.

Current dual damascene processing technology entails depositing a triple layer sandwich consisting of a thick layer of a dielectric material, an etch stop material having a high etch selectivity to the dielectric layer, and a second thick layer of a dielectric material. The two level structure is formed by masking and etching through the top layer of dielectric material stopping on the layer of etch stop material, etching the etch stop material only, then performing a second masking and etching process with the second masking being an oversize masking. The second etch is to the dielectric material underlying the lower layer of dielectric material.

The increased density has caused a requirement to increase the aspect ratio of the photolithographic processes. However, the current dual damascene process has several problems that prevent the further increase of the aspect ratio. One problem is caused by the formation of a polymer residue during the etch process. A second problem is the limitations of the lithography systems being used to expose the photoresist in the resist-as-mask process.

As discussed above, the dimensions required in current semiconductor processing are extremely small, on the order of 0.5 $\mu$m and smaller. As is known in the semiconductor manufacturing art, with wet etching, fine patterning of dimensions of this kind involves forming a resist film in the prescribed pattern on the surface of the layer to be patterned. During the wet etching process, isotropic etching characteristics are exhibited. This causes undercutting in the width direction simultaneously with the etching in the depth direction. This makes it difficult to obtain the desired dimensions making the wet etching process unsuitable. In contrast, with dry etching, the amount of etching in the width direction is very small compared to the amount of etching in the depth direction on the layer to be patterned. Because of this, dry etching is much more suitable for the fine patterning such as that described above.

However, during dry etching, a polymer residue is created and is deposited on surfaces in the etched areas forming a polymer residue layer. The polymer residue layer contains components of the gas used in the etching process, structural components of the patterned layer, including the resist and metal components (for example, iron, chromium and nickel from structural components of the etching equipment). This polymer residue layer cannot be removed by conventional plasma ashing (transliteration) or mixtures of sulfuric acid, hydrogen peroxide and water. These cleaners are used to remove organic contaminants and generally consist of a 3:1 mixture of concentrated sulfuric acid and a 30% mixture of hydrogen peroxide and water.

The presence of the polymer residue layer results in problems such as the following:

1. When a polymer residue layer is formed on the side walls of a contact hole (via), the area of contact between the layers being connected is reduced causing an increase in the contact resistance;
2. When a polymer residue layer is formed, it becomes more difficult to adhere wiring materials to the insulating layer (for example, the interlayer dielectric);
3. When a polymer residue layer is formed, the insulation provided by the interlayer dielectric becomes unreliable; and
4. When the polymer residue layer contains metal components, they may contaminate production facilities, such as electric furnaces or cleaning equipment used in the steps after patterning.

Imaging during the formation of resist structures on a silicon wafer continues to be the driving force in optical and nonoptical microlithography. The test of a successful lithographic process begins with imaging, and once the images are satisfactorily formed, the rest of the process can be developed. While all of the integrated circuit manufacturing process steps are interrelated, imaging is the most critical process step in determining or setting the limits for pattern size and relationship. The historical trend in microelectronics has been one of reducing image size and increasing wafer productivity at the exposure step.

The techniques of wafer imaging in microlithography have undergone considerable change. One method of increasing resolution in wafer imaging lithography is to use shorter wavelength illumination. Optical photolithographic techniques have typically operated on the G, H, and I energy lines of the mercury spectrum, corresponding to the 436, 405 and 365 nanometer wavelengths, respectively. The logical pathway for the further increase of resolution in resist exposure is to move below the wavelengths of the major mercury lines. The benefit of using shorter exposing wavelengths to obtain increased resolution is based on a simple mathematical relationship. In an optical system, resolution is a function of wavelength according to the well-known relationship:

$$v_o = 2NA/\lambda,$$

where $v_o$ is cutoff frequency (normalized to unity) in line pairs per mm, NA is the numerical aperture and $\lambda$ is the wavelength in mm. The numerical aperture is defined as 2NA=1/ƒ where ƒ is the ƒ-number of the optical system and is equal to the focal length/effective diameter. Combining the two equations gives the relationship $v_o=1/\lambda f$. From this relationship it can be seen that decreasing the wavelength increases the resolution of the optical system $\lambda$.

Short wavelength lithography techniques permit finer pattern resolution; however, a number of rules must be obeyed to take advantage of the natural gain in pattern density caused by reduced wavelength. The minimum line width and depth of focus are a function of the numerical aperture and wavelength of the optical imaging tool. For example, at a wavelength of 250 nanometers, the numerical aperture is limited to 0.5, with an accompanying depth of focus of 0.5 $\mu$m. The depth of focus should never be greater than the resist thickness or image dimensional variation will occur in the resist. In the resist, the contrast must be high to allow for the formation of high-aspect-ratio images.

FIGS. 1B & 1C illustrate one of the problems when a feature such as a trench has a high aspect ratio. The depth of focus of the lithography system has to be set above the bottom of the trench and results in tapered sides 122. Another cause of the tapered sides 122 is the buildup of a polymer residue layer that deters the etch process and can eventually stop the etch process.

FIGS. 2F–2J illustrate a problem resulting from a process in which a layer of scum 206 is left on the bottom of the trench after the process to etch the resist. FIGS. 2G–2J illustrate the results of an overetching process that is necessary to remove the layer of scum 206 from the bottom of the trench. FIG. 2J shows that the resulting width $W_3$ of the trench is wider than the desired width $W_1$, resulting in a decreased density for the semiconductor device.

Therefore, what is needed is a method of manufacturing semiconductor devices that avoids the problems associated with the buildup of a layer of polymer residue and the limitations of the photolithographic systems used in semiconductor processing.

SUMMARY OF THE INVENTION

According to the present invention, the foregoing and other objects and advantages are attained by a method of manufacturing a semiconductor device with multiple dual damascene structures that maintains the maximum density.

In accordance with an aspect of the invention a first dual damascene structure having a first via and a first trench is formed in a first interlayer dielectric and a first etch stop layer formed on the planarized surface of the first interlayer dielectric. Two layers of interlayer dielectric separated by a second etch stop layer is formed on the surface of the first etch stop layer. A third etch stop layer is formed on the upper layer of interlayer dielectric and a first photoresist layer formed on the third etch stop layer. The photoresist layer is etched having a dimension coinciding with a width dimension of the first via. The third etch stop layer is selectively etched and the first photoresist layer removed and replaced by a second photoresist layer. The second photoresist layer is etched having a dimension coinciding with a width dimension of the first trench. The two layers of interlayer dielectric and the first, second and third etch stop layers are etched to form a second dual damascene structure having a second via and a second trench having the same dimensions as the first dual damascene structure.

The described method of manufacturing semiconductor devices thus provides semiconductor devices having multiple dual damascene structures. The described method maintains the maximum density in the semiconductor devices.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use and further objects and advantages thereof, will best be understood by reference to the following detailed description of an illustrative embodiment when read in conjunction with the accompanying drawings, wherein:

FIG. 4A shows a partially completed semiconductor device in accordance with the present invention showing a finished dual damascene via and trench in a first layer of interlayer dielectric covered with a first seal layer, a second layer of interlayer dielectric, a second seal layer formed on the second layer of interlayer dielectric, a third layer of interlayer dielectric, a third seal layer formed on the third layer of interlayer dielectric and a layer of photoresist formed on the third seal layer;

FIG. 4B shows the partially completed semiconductor device shown in FIG. 4A with the layer of photoresist patterned and etched to expose a portion of the third seal layer of nitride;

FIG. 4C shows the partially completed semiconductor device shown in FIG. 4B with the exposed portion of the third seal layer removed;

FIG. 4D shows the partially completed semiconductor device shown in FIG. 4C with the remaining portion of the photoresist layer removed;

FIG. 4E shows the partially completed semiconductor device shown in FIG. 4D with a second layer of photoresist formed on the structure shown in FIG. 4D;

FIG. 4F shows the partially completed semiconductor device shown in FIG. 4E with the second layer of photoresist patterned and etched exposing a portion of the third layer of interlayer dielectric and a portion of the third layer of seal layer;

FIG. 4G shows the partially completed semiconductor device shown in FIG. 4F with the third layer of interlayer dielectric etched to expose a portion of the third seal layer;

FIG. 4H shows the partially completed semiconductor device shown in FIG. 4G with the exposed portion of the third seal layer;

FIG. 4I shows the partially completed semiconductor device shown in FIG. 4H with the remaining portion of the second layer of photoresist removed;

DETAILED DESCRIPTION

Reference is now made in detail to a specific embodiment of the present invention that illustrates the best mode presently contemplated by the inventors for practicing the invention.

Figure 1C:
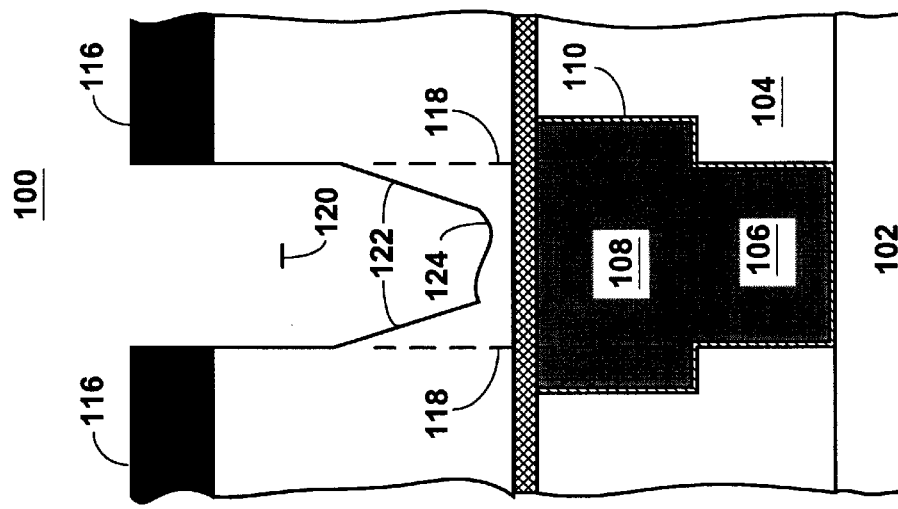
FIG. 1C shows the partially completed prior art semiconductor device shown in FIG. 1B showing the structure after an etch step has been carried out.
Figure 1B:
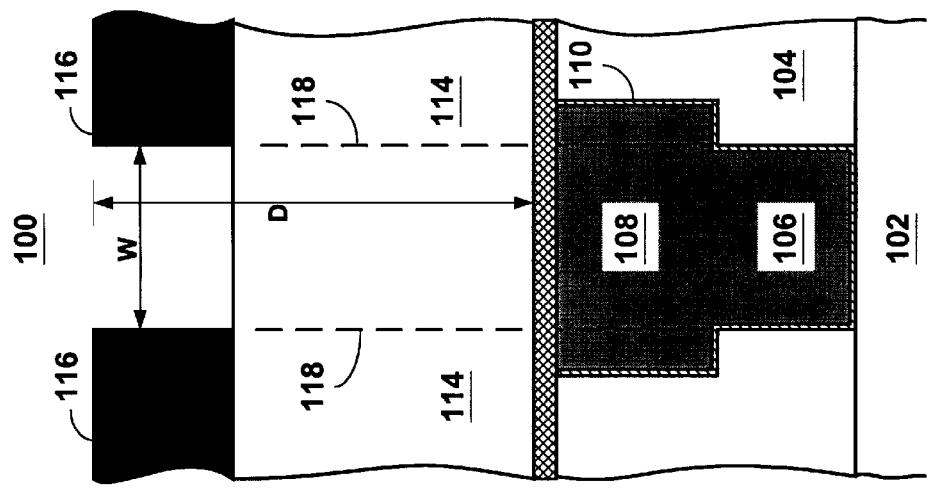
FIG. 1B shows the partially completed prior art semiconductor device shown in FIG. 1A with the layer of photoresist patterned and etched.
Figure 1A:
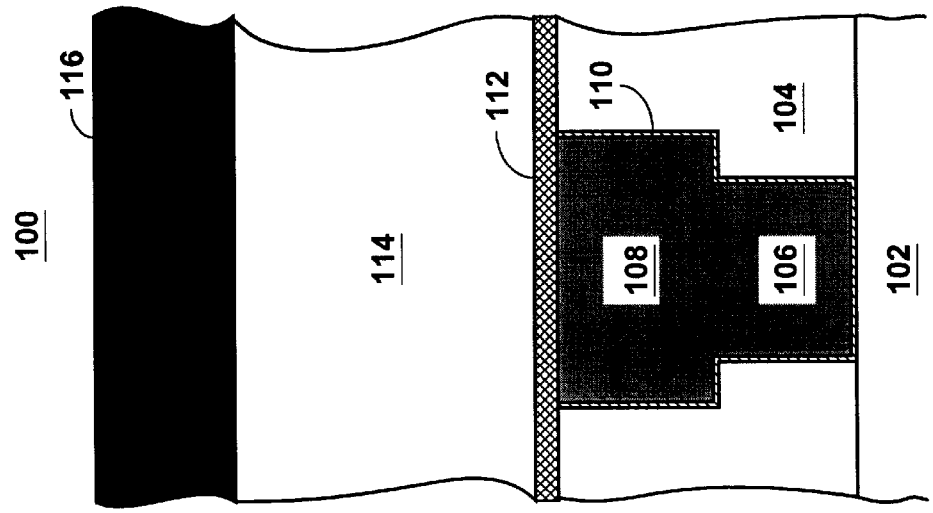
FIG. 1A shows a partially completed prior art semiconductor device showing a finished dual damascene via and trench in a first layer of interlayer dielectric covered with a seal layer of nitride, a second layer of interlayer dielectric and a layer of photoresist.

FIG. 1A shows a partially completed prior art semiconductor device 100. The partially completed semiconductor device 100 is formed in a semiconductor substrate on and in which active devices (not shown) are formed. The substrate and active devices are indicated generally at 102 and will not be discussed further since the methods of forming active devices in and on a semiconductor substrate are well known in the semiconductor manufacturing art and such methods of formation are not a part of the present invention. The surface of the substrate 102 is planarized and serves as a uniform flat surface on which to form further structures on the substrate. An initial layer of interlayer dielectric 104 is formed on the planarized surface of the semiconductor substrate 102 and serves to encapsulate and insulate all of the active devices formed in and on the substrate 102. The initial layer of interlayer dielectric 104 is typically formed of silicon dioxide ($SiO_2$). The partially completed semiconductor device 100 includes a via 106 and a trench 108. As is known in the semiconductor manufacturing art, vias and trenches such as the via 106 and the trench 108 that make up the dual damascene structure and which are the subject of the present invention connect electrodes of the active devices, such as drains, sources and gates to other electrodes on the same level or connect the electrodes to electrodes on other levels of the semiconductor device. Via 106 and trench 108 are filled with a conductive material such as tungsten (W), aluminum (Al) or copper (Cu). A barrier layer 110 is formed on the walls of via 106 and trench 108 to prevent diffusion of materials through the walls of via 106 and trench 108. For example, if the conductive material that fills via 106 and trench 108 is copper, the barrier layer 110 is necessary to prevent the copper from diffusing into the surrounding silicon material. The barrier layer 110 can be formed from one of several materials including TiN (titanium nitride), TaN (tantalum nitride) or $W_2N$ (tungsten nitride). The surfaces of the initial interlayer dielectric 104 and trench 108 are planarized and serve as a uniform surface on which to form further structures on the interlayer dielectric 104. A boundary layer or etch stop layer 112 is formed on the planarized surface. Etch stop layer 112 is typically formed of a nitride material such as silicon oxynitride (SiON) or silicon nitride ($Si_3N_4$). The purpose of etch stop layer 112 is to stop a subsequent etch process that etches the second layer of interlayer dielectric 114 that is formed on etch stop layer 112. A layer of photoresist 116 is formed on the interlayer dielectric 114. The layer of photoresist 116 is relatively thick because in a later etch process, the layer of photoresist 116 is partially consumed by the etch process and the layer of photoresist 116 must be thick enough to prevent the underlying interlayer dielectric 114 from being etched.

FIG. 1B shows the partially completed semiconductor device 100 as shown in FIG. 1A with the layer of photoresist 116 etched. All etch processes discussed are anisotropic etch processes, that is, etch processes that are directional as opposed to isotropic etch processes that etch in all directions. The dimensions of the etched portions are such that the width W of the etched portion coincides with the original via width as indicated by dashed lines 118. The depth D is determined by the required thickness of the interlayer dielectric 114 and the required thickness of the photoresist layer 116. The photoresist layer 116 has to have sufficient thickness because it will be partially consumed during a subsequent etch process.

FIG. 1C shows the partially completed semiconductor device 100 as shown in FIG. 1B after an etch process to etch the interlayer dielectric 114. As shown, the layer of photoresist 116 has been partially consumed during the etch process. Because of the depth of the interlayer dielectric 114 and the layer of photoresist 116, the focus of the lithographic system has to be set at an intermediate point such as 120. The intermediate focus causes portions 122 of the sidewalls to slope away from vertical. Another cause of the sloping portions 122 is that a polymerization process takes place during the etch process and causes a buildup of a polymer on the sidewalls that deters the etch process and eventually stops the etch process. As shown, the etch process may not reach the etch stop 112 layer leaving a portion 124 of the interlayer dielectric 114 in the bottom of the trench.

In the case in which the etch process does not reach etch stop layer 112, a subsequent process will be prevented from making electrical contact with the conductive material in the trench 108 and will cause the device to fail. In the case in which the etch process reaches the etch stop layer 112, the sloped portions 122 of the sidewalls decrease the contact area between the etched trench and the underlying trench 108. The decreased contact area causes increased resistance and the heat caused by the increased resistance can cause the semiconductor device to fail.

FIGS. 2A–2J illustrate a prior art method of attempting to manufacture a semiconductor device 200 to solve the problems illustrated in FIGS. 1A–1C.

Figure 2C:
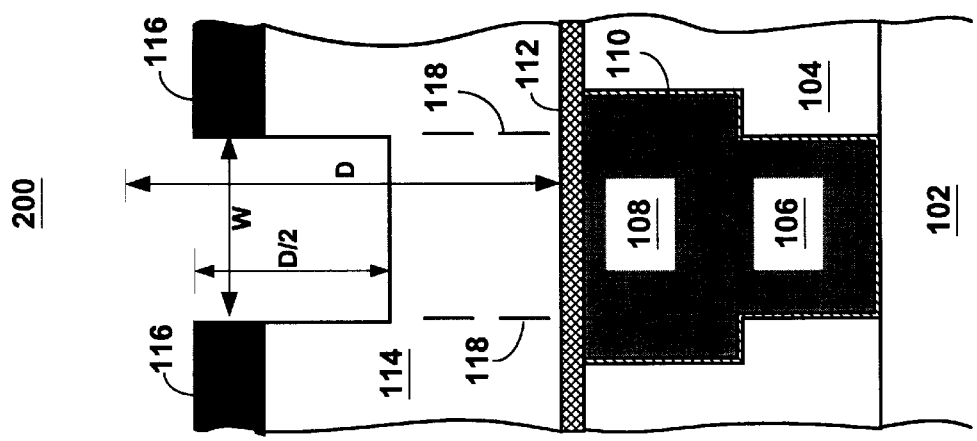
FIG. 2C shows the partially completed prior art semiconductor device shown in FIG. 2B with the second layer of interlayer dielectric etched to a midpoint of the second layer of interlayer dielectric.
Figure 2B:
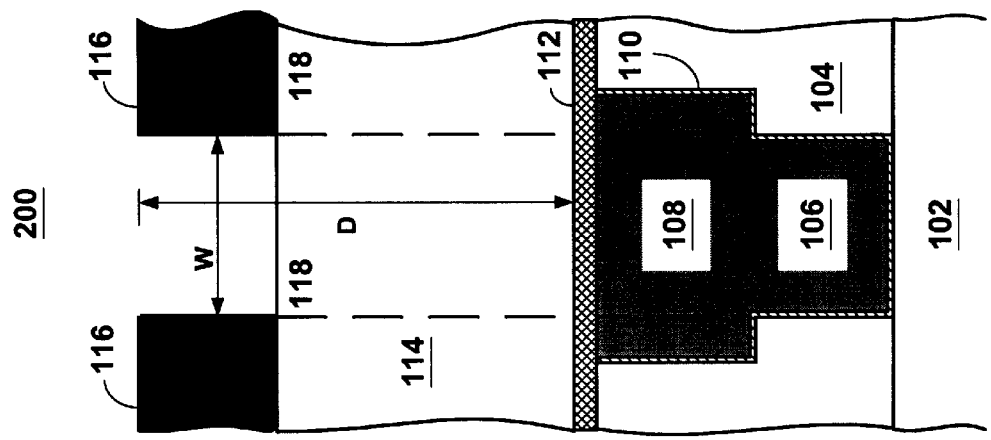
FIG. 2B shows the partially completed prior art semiconductor device shown in FIG. 2A with the layer of photoresist patterned to the dimensions of the via and etched.
Figure 2A:
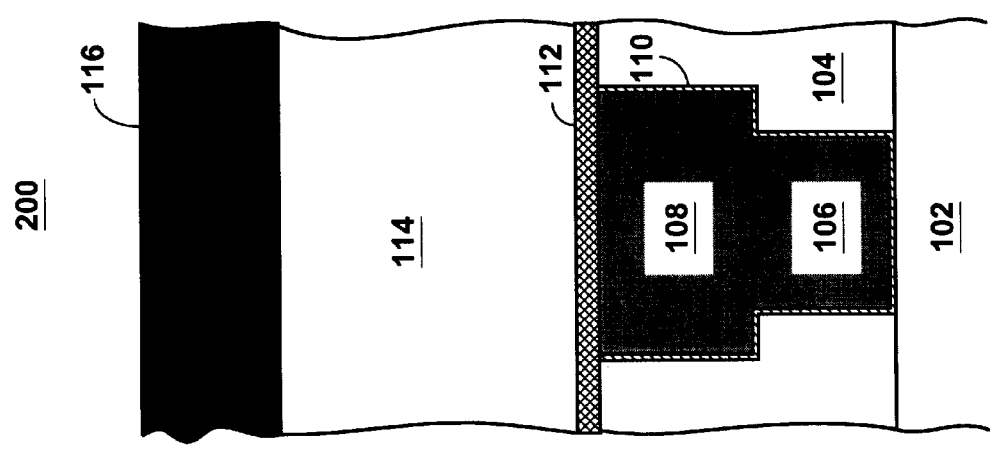
FIG. 2A shows the partially completed prior art semiconductor device shown in FIG. 1A.

FIGS. 2A & 2B correspond to FIGS. 1A & 1B and illustrate that the methods of manufacturing the semiconductor device up to this step in the manufacturing process illustrated in FIGS. 1A–1C and in the manufacturing process illustrated in FIGS. 2A–2J are substantially identical.

FIG. 2C shows the partially completed semiconductor device 200 as shown in FIG. 2B with the etch process stopped after the depth of the etch process has reached approximately a midpoint D/2 of the depth D. The etch process is stopped before the etch process produces sloped portions of the sidewalls of the trench as shown in FIG. 1C at 122. The etch process is stopped before the focus of the lithography system is exceeded and before the polymerization affects the etch process to any extent.

Figure 2F:
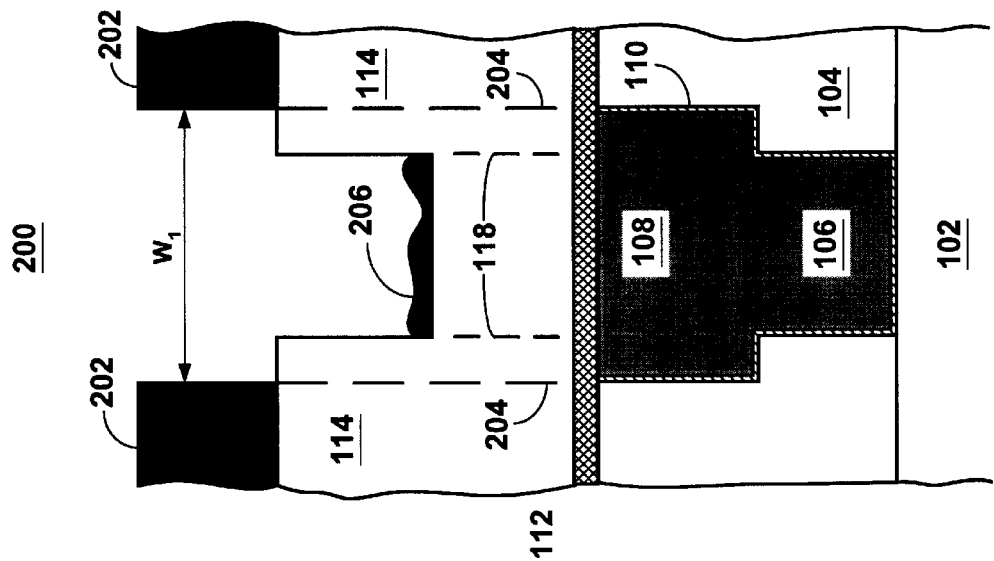
FIG. 2F shows the partially completed prior art semiconductor device shown in FIG. 2E with the second layer of photoresist patterned and showing resist scum remaining after the second layer of photoresist is patterned.
Figure 2E:
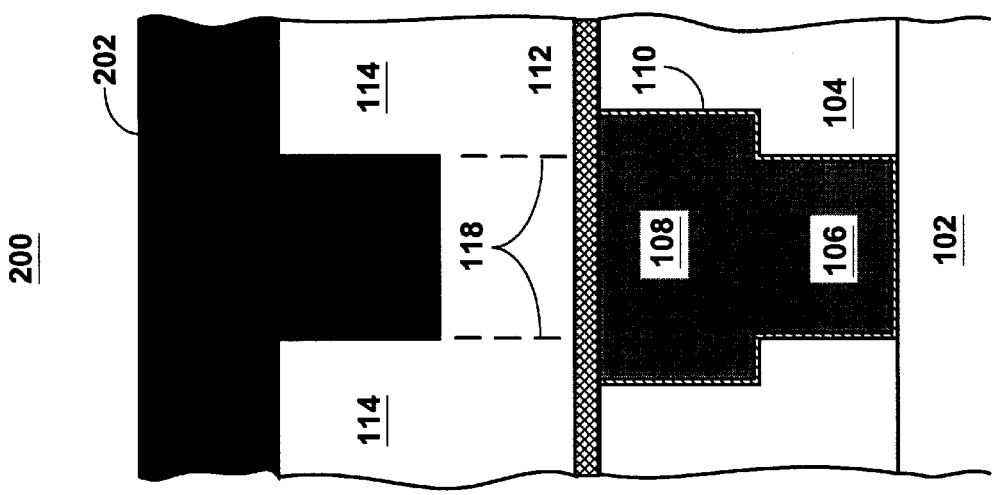
FIG. 2E shows the partially completed prior art semiconductor device shown in FIG. 2D with a second layer of photoresist formed on the exposed surfaces of the structure shown in FIG. 2D.
Figure 2D:
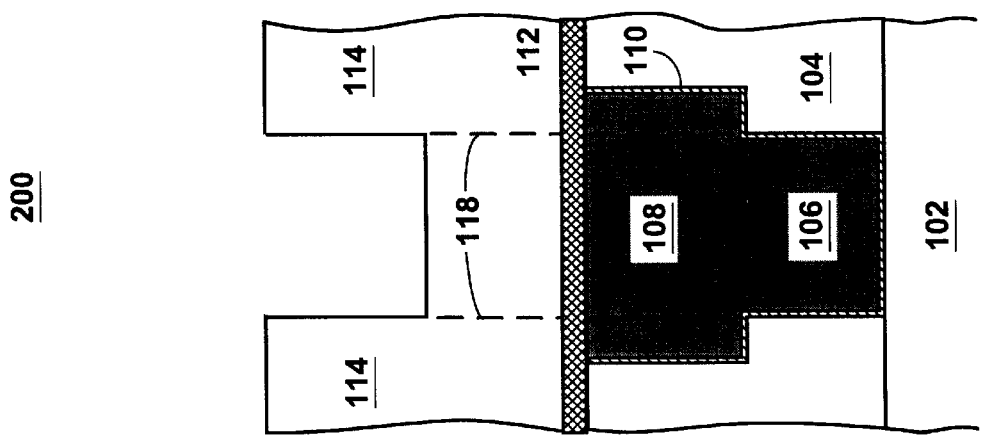
FIG. 2D shows the partially completed prior art semiconductor device shown in FIG. 2C with the remaining photoresist removed.

FIG. 2D shows the partially completed semiconductor device 200 as shown in FIG. 2C with the remaining portion of the layer of photoresist removed.

FIG. 2E shows the partially completed semiconductor device 200 with a second layer of photoresist 202 formed on the exposed surfaces of the semiconductor device 200.

FIG. 2F shows the partially completed semiconductor device 200 as shown in FIG. 2E with the second layer of photoresist 202 etched with a width dimension $W_1$ that corresponds to the width of the trench 108 as indicated by the dashed lines 204. Because of the depth of the etch process and because the focus of the lithographic system is set above the bottom if the trench, the removal of the photoresist from the bottom of the trench is not complete and a layer of "scum" 206 is left on the bottom of the trench. The layer of scum 206 must be removed before the next etch process.

Figure 2I:
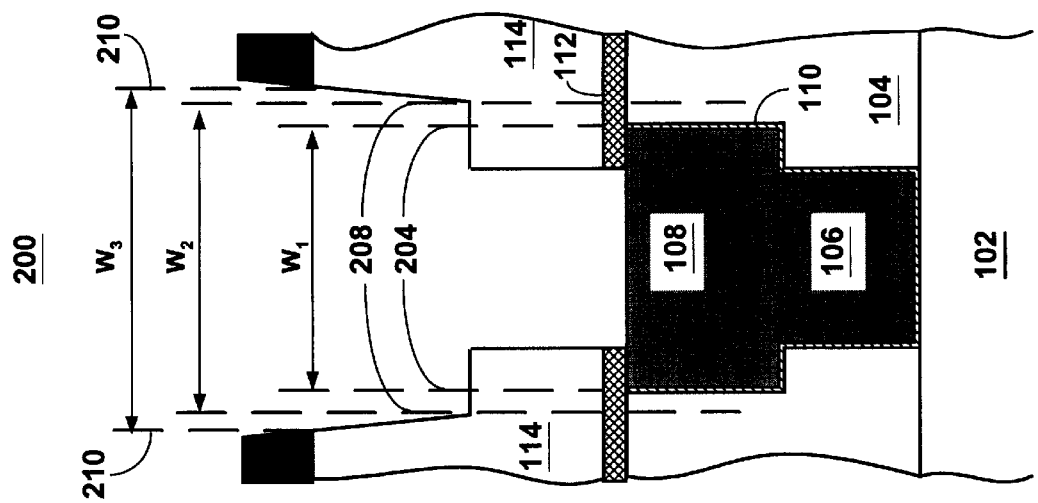
FIG. 2I shows the partially completed prior art semiconductor device shown in FIG. 2H with the exposed seal layer of nitride removed.
Figure 2H:
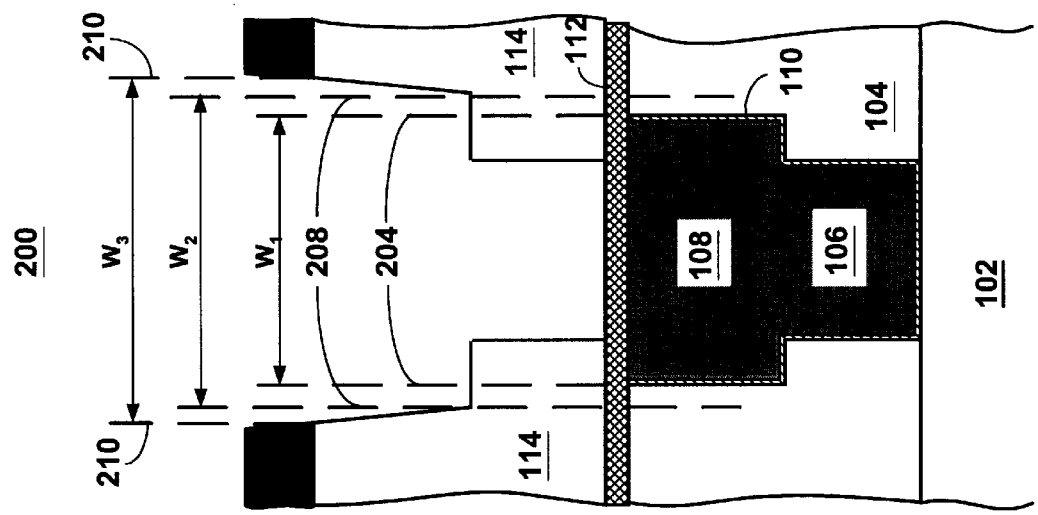
FIG. 2H shows the partially completed prior art semiconductor device shown in FIG. 2G showing the second layer of interlayer dielectric etched to the seal layer of nitride.
Figure 2G:
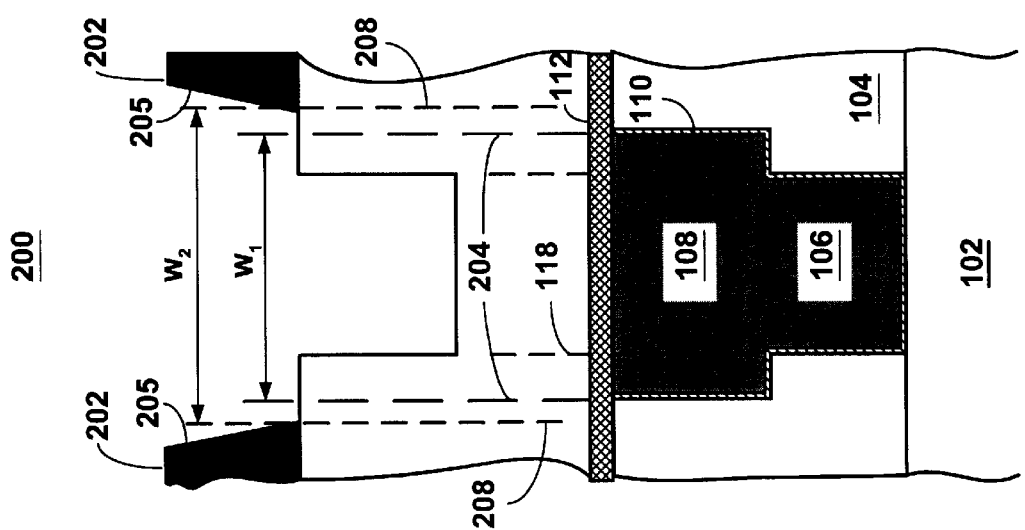
FIG. 2G shows the partially completed prior art semiconductor device shown in FIG. 2F showing the results on the remaining second layer of photoresist after a process to remove the photoresist scum.

FIG. 2G shows the partially completed semiconductor device 200 as shown in FIG. 2F with a second process completed to remove the layer of scum 206 from the bottom of the trench. In order to completely remove the layer of scum 206, it is necessary to overexpose the second layer of photoresist 202. The overexposure of the second layer of photoresist 202 results in the sidewalls 205 of the second layer of photoresist 202 becoming sloped and having a minimum width $W_2$ that is larger than $W_1$. The width $W_2$ is indicated by dashed lines 208. The width $W_1$ is the desired width of the trench. The width $W_2$ results in decreased density of the finished semiconductor device.

FIG. 2H shows the partially completed semiconductor device 200 shown in FIG. 2G after an etch process to etch the layer of interlayer dielectric 114. Because the etch process to etch the interlayer dielectric 114 is anisotropic, the slope in the sidewalls 205 is transferred during the etch process to the walls of the trench. The minimum width of $W_2$ and the maximum width $W_3$ are transferred to the walls of the etched trench. The maximum width $W_3$ is indicated by dashed lines 210.

FIG. 2I shows the partially completed semiconductor device 200 shown in FIG. 2H with the exposed portion of the etch stop layer 112 removed so that the top surface of the conductive material in the trench 108 is exposed.

Figure 2J:
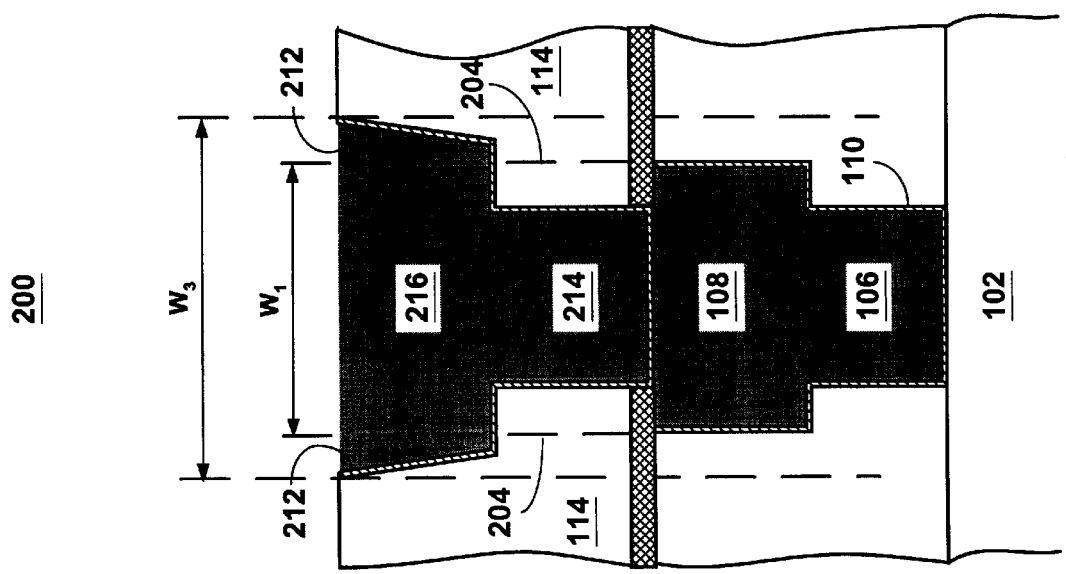
FIG. 2J shows the partially completed prior art semiconductor device shown in FIG. 2I with a barrier layer formed on the surface of the trench and via structure and the trench and via filled with a conductive material.

FIG. 2J shows the partially completed semiconductor device 200 shown in FIG. 2I with a layer of barrier material 212 formed on the walls of the etched portion of the interlayer dielectric 114 and the etched portion of the interlayer dielectric 114 filled with a conductive material forming a via 214 and a trench 216. The problem with the prior art method illustrated in FIGS. 2A–2J is that the width $W_3$ is significantly wider than the width $W_1$, which is the desired width to provide the pitch that provides the desired density of semiconductor devices. As can be appreciated, current semiconductor devices can have many millions of trenches (conductive lines) on a layer and the width difference ($W_3-W_1$) can be extremely significant.

FIGS. 3A–3K illustrate another prior art method of attempting to manufacture a semiconductor device 300 to solve the problems illustrated in FIGS. 1A–1C and FIGS. 2A–2J.

Figure 3B:
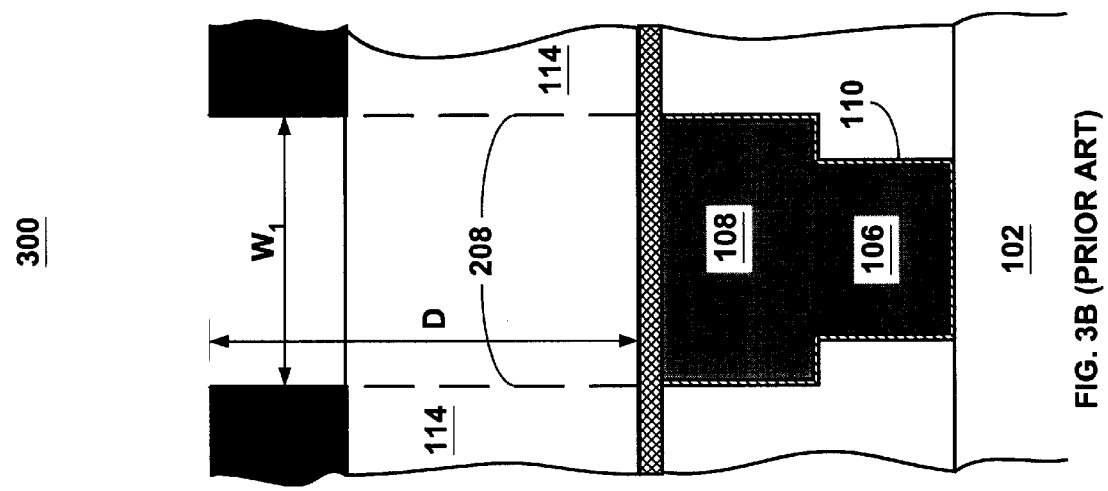
FIG. 3B shows the partially completed prior art semiconductor device shown in FIG. 3A with the layer of photoresist patterned with the dimensions of the trench and etched.
Figure 3A:
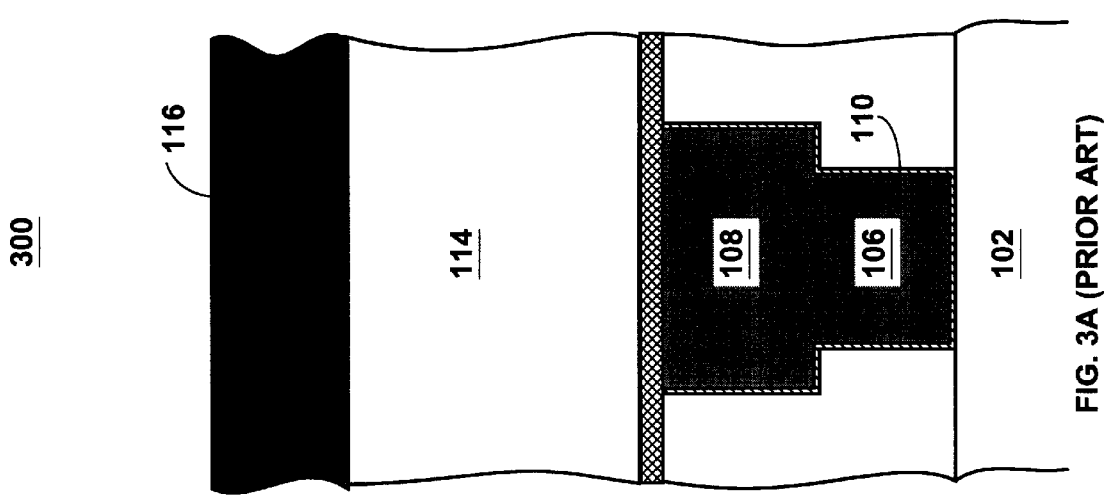
FIG. 3A shows the partially completed prior art semiconductor device shown in FIG. 1A.

FIG. 3A corresponds to FIG. 2A and illustrates that the methods of manufacturing the semiconductor up to this step in the manufacturing process illustrated in FIGS. 2A–2J and the manufacturing process illustrated in FIGS. 3A–3K are substantially identical.

FIG. 3B shows the partially completed semiconductor device 300 shown in FIG. 3A with the layer of photoresist 116 etched with a dimension $W_1$ that corresponds to the width of the trench 108 as indicated by dashed lines 208. Compared to the initial photoresist etch shown in FIG. 2B having a dimension W, the dimension $W_1$ is greater than W. The result is that the aspect ratio $W_1/D$ is greater, theoretically allowing an etch of the interlayer dielectric 114 to proceed deeper without the sloped trench walls as shown in FIG. 1C.

Figure 3E:
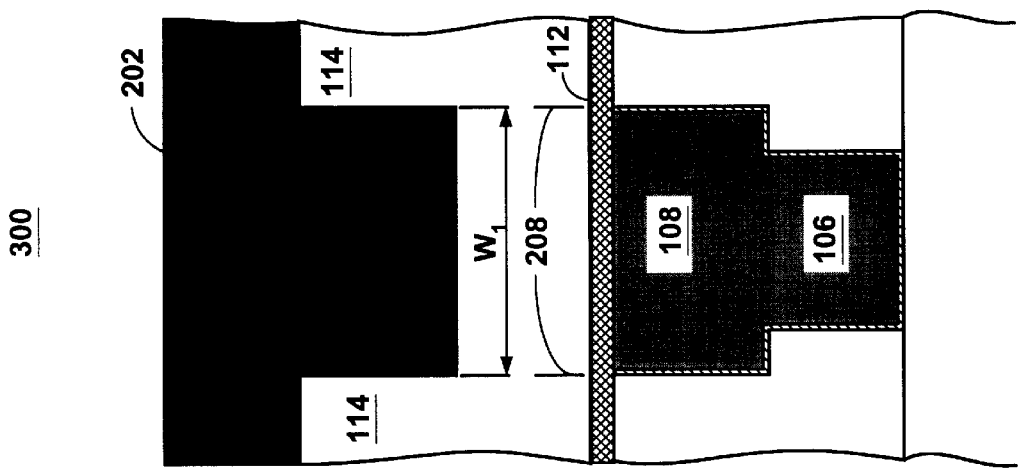
FIG. 3E shows the partially completed prior art semiconductor device shown in FIG. 3D with a second layer of photoresist formed on the exposed surfaces of the structure shown in FIG. 3D.
Figure 3D:
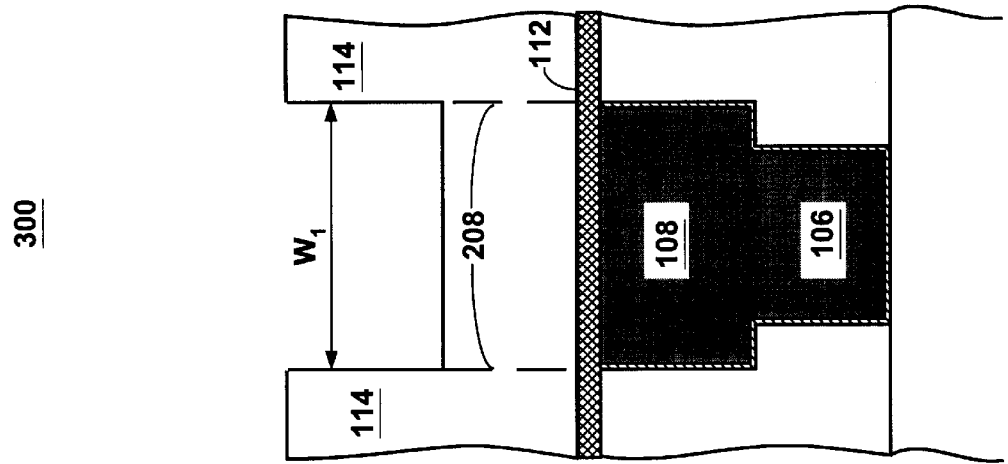
FIG. 3D shows the partially completed prior art semiconductor device shown in FIG. 3C with the remaining photoresist removed.
Figure 3C:
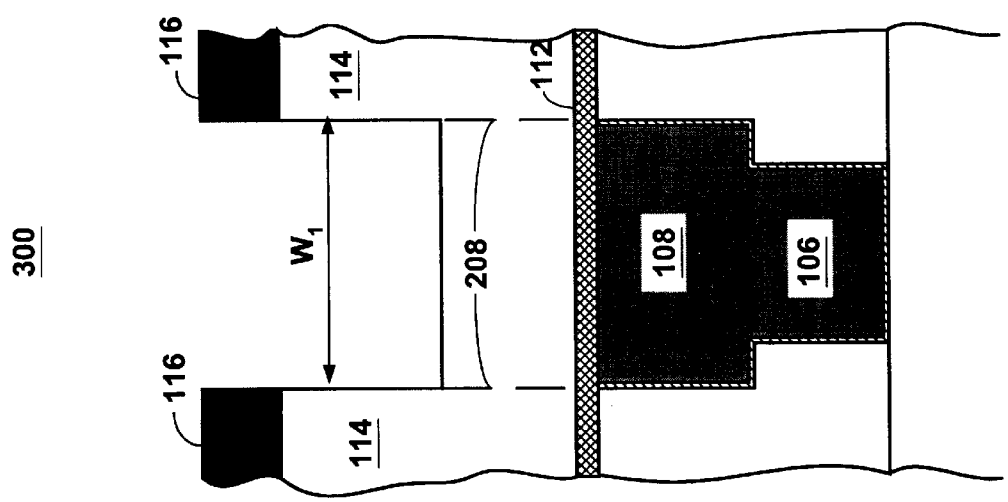
FIG. 3C shows the partially completed prior art semiconductor device shown in FIG. 3B with the second layer of interlayer dielectric etched to a midpoint of the second layer of interlayer dielectric.

FIG. 3C shows the partially completed semiconductor device 300 shown in FIG. 3B after an anisotropic etch process that is stopped when the etch reaches a midpoint of the interlayer dielectric 114. The etch process is stopped before the etch produces sloped portions of the sidewalls. The etch process is stopped before the focus of the lithography system is exceeded and before the polymerization affects the etch process to any extent.

FIG. 3D shows the partially completed semiconductor device 300 shown in FIG. 3C with the remaining first layer of photoresist removed.

FIG. 3E shows the partially completed semiconductor device 300 shown in FIG. 3D with a second layer of photoresist 202 formed on the semiconductor device.

Figure 3H:
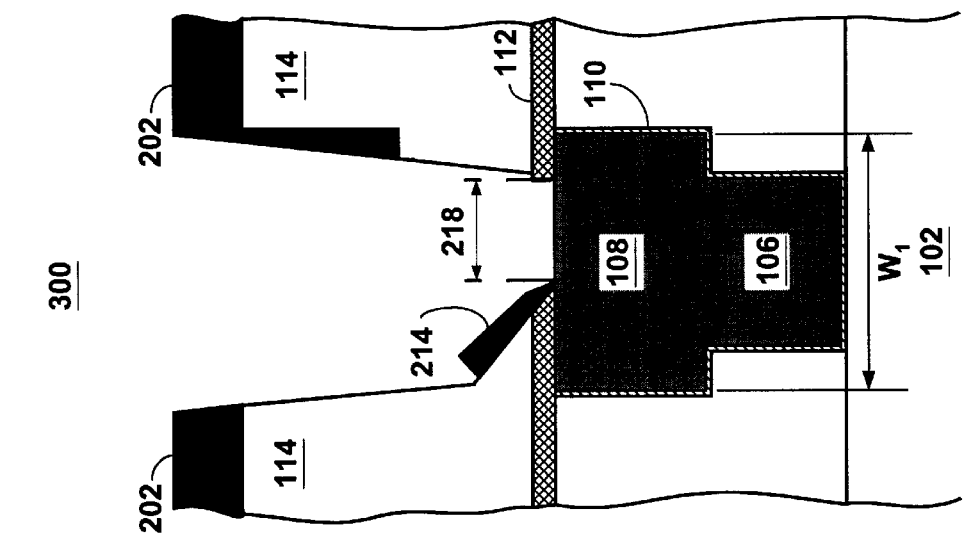
FIG. 3H shows the partially completed prior art semiconductor device shown in FIG. 3G showing the profile of the trench and a piece of photoresist in the trench.
Figure 3G:
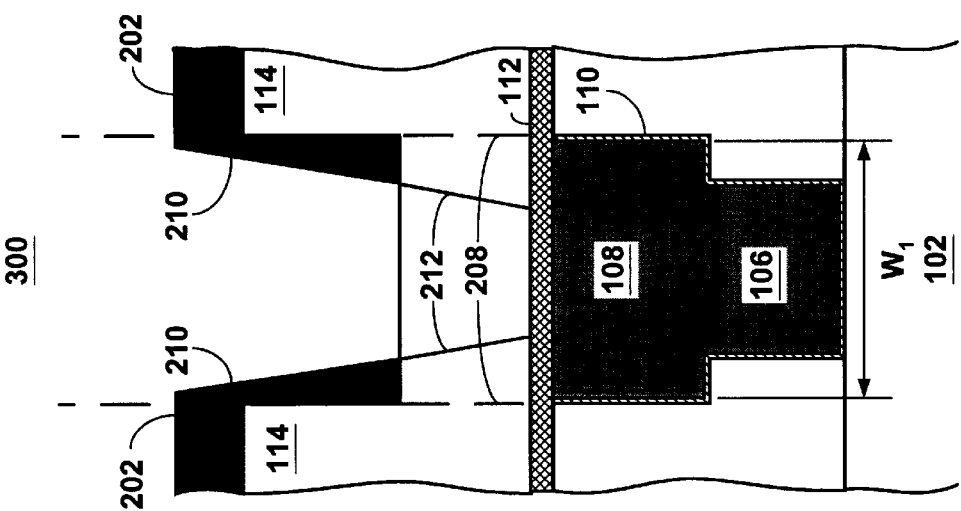
FIG. 3G shows the partially completed prior art semiconductor device shown in FIG. 3F showing the second layer of interlayer dielectric etched to the seal layer.
Figure 3F:
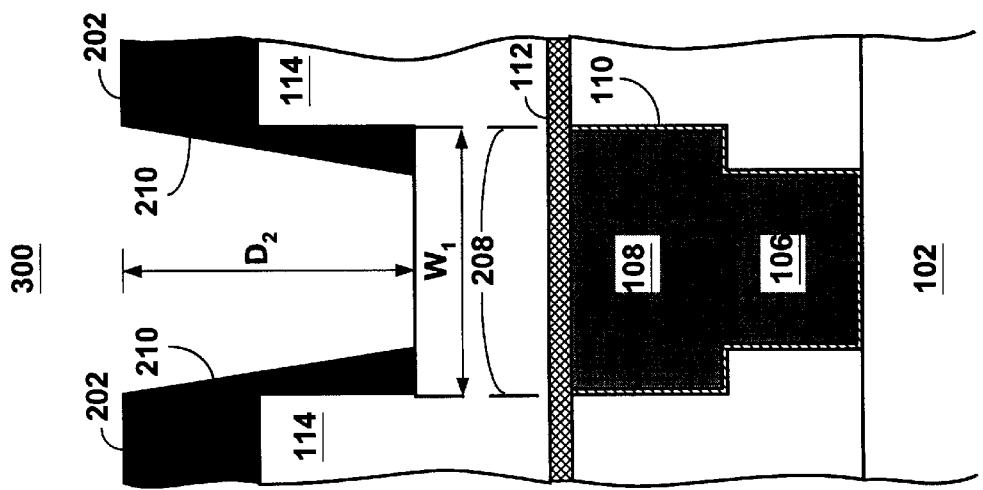
FIG. 3F shows the partially completed prior art semiconductor device shown in FIG. 3E with the second layer of photoresist patterned and etched.

FIG. 3F shows the partially completed semiconductor device 300 shown in FIG. 3E with the second layer of photoresist 202 etched. Because of the width $W_1$ of the trench and the depth $D_2$ of the second layer of photoresist in the trench, the etch process of the second layer of photoresist 202 results in tapered sides 210 on the second layer of photoresist 202.

FIG. 3G shows the partially completed semiconductor device 300 shown in FIG. 3F after an anisotropic etch process that is stopped by the etch stop layer 112. The tapered sides 210 of the resist layer 202 are transferred to the sidewalls 212 of the layer of dielectric 114.

FIG. 3H shows the partially completed semiconductor device 300 shown in FIG. 3F with a portion 214 of resist broken off of the sidewall and lying in the bottom of the trench. The portion 214 of resist prevents the portion 216 of the layer of dielectric 114 from being etched during the remainder of the etch process. The exposed portion of etch stop layer 112 is shown removed to expose the conductive material in the underlying trench 108. It is to be noted that the contact area 218 is substantially less than the intended contact area 220.

Figure 3K:
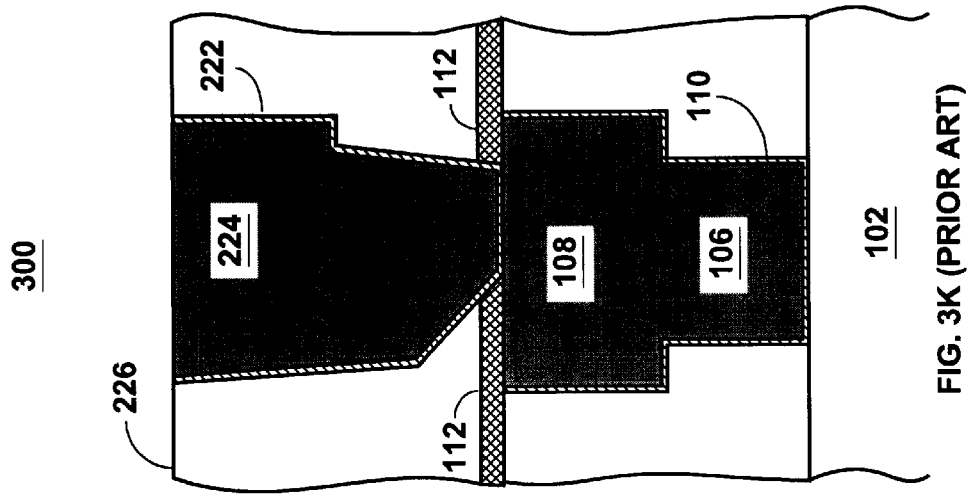
FIG. 3K shows the partially completed prior art semiconductor device shown in FIG. 3J with the trench filled with a conductive material.
Figure 3J:
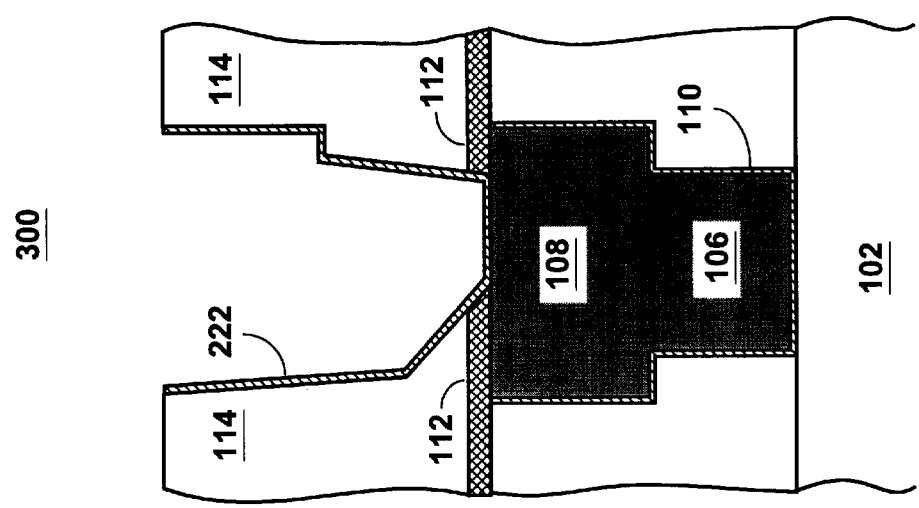
FIG. 3J shows the partially completed prior art semiconductor devices shown in FIG. 3I with a barrier layer formed on the surface of the trench structure.
Figure 3I:
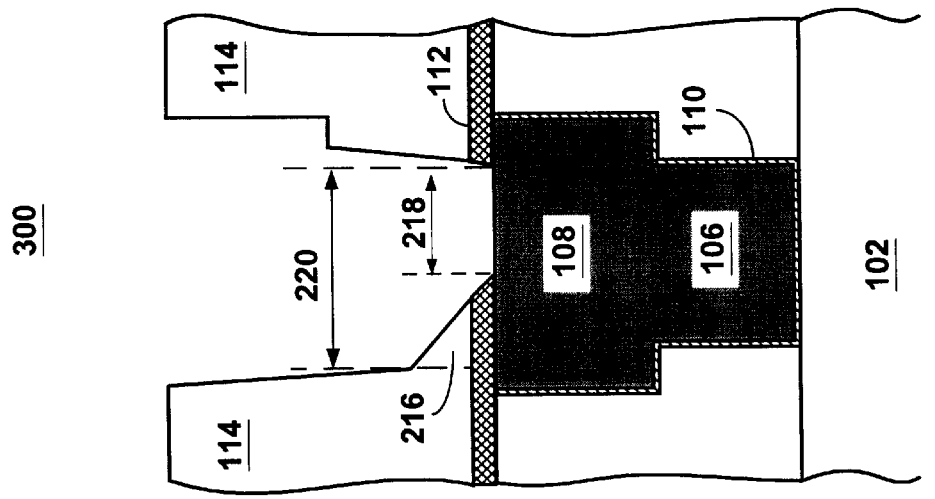
FIG. 3I shows the partially completed prior art semiconductor device shown in FIG. 3H with the remaining photoresist removed.

FIG. 3I shows the partially completed semiconductor device 300 shown in FIG. 3H with the remaining portions of the second layer of resist removed.

FIG. 3J shows the partially completed semiconductor device 300 shown in FIG. 3H with a barrier layer 222 formed on the walls of the etched trench 224. The barrier layer 222 is formed on the walls of the etched trench 224 to prevent diffusion of materials through the walls of the trench 224. The barrier layer 222 can be one of several materials including TiN (titanium nitride), TaN (tantalum nitride) or $W_2N$ (tungsten nitride).

FIG. 3K shows the partially completed semiconductor device 300 shown in FIG. 3J with the trench 224 filled with a conductive material such as aluminum, tungsten, copper or doped polysilicon. The top surface 226 of semiconductor device 300 is planarized to form a smooth surface for subsequent processing.

FIGS. 4A–4L illustrate a method of manufacturing a semiconductor device 400 in accordance with the present invention that avoids the problems described and shown in FIGS. 1A–1C, 2A–2J and 3A–3K.

FIG. 4A shows a partially completed semiconductor device 400. The partially completed semiconductor device 400 is formed in a semiconductor substrate on and in which active devices (not shown) are formed. The substrate and active devices are indicated generally at 402 and will not be discussed further since the methods of forming active devices in a semiconductor substrate are well known in the semiconductor manufacturing art and such methods of formation are not a part of the invention. The surface of the substrate 402 is planarized and serves as a uniform flat surface on which to form further structures on the substrate 402. An initial layer of interlayer dielectric 404 is formed on the planarized surface of the semiconductor substrate 402 and serves to encapsulate and insulate all of the active structures formed on and in the substrate 402. The interlayer dielectric 404 is typically formed from silicon dioxide ($SiO_2$). The partially completed semiconductor device 400 includes via 406 and trench 408. As is known in the semiconductor manufacturing art, the vias and trenches such as via 406 and trench 408 formed by the method of the present invention connect electrodes of the active devices such as drains, sources and gates formed in the substrate 402 to other electrodes on the same level or connect the electrodes to electrodes on other levels of the semiconductor device. Via 406 and trench 408 are filled with a conductive material such as tungsten (W), aluminum (Al), copper (Cu) or doped polysilicon.

A barrier layer 410 is formed on the walls of via 406 and trench 408 to prevent diffusion of materials through the walls of via 406 and trench 408. If the conductive material that fills via 406 and trench 408 is copper, the barrier layer 410 is necessary to prevent the copper from diffusing into the surrounding material. The barrier layer 410 can be one of several materials including TiN (titanium nitride), TaN (tantalum nitride) or $W_2N$ (tungsten nitride).

The surface of the initial interlayer dielectric 404 and trench 408 is planarized and serves as a uniform surface on which to form further structures on the interlayer dielectric 404. Etch stop layer 412 is formed on the planarized surface. Etch stop layer 412 is typically formed of a nitride material such as silicon oxynitride (SiON) or silicon nitride ($Si_3N_4$). The purpose of etch stop layer 412 is to stop a subsequent etch process that etches the second layer of interlayer dielectric 414 that is formed on etch stop layer 412. Typically the thickness of the boundary etch stop layer 412 is in the range of 500–1000 Å.

The surface of the second layer of interlayer dielectric 414 is planarized and etch stop layer 416 is formed on the surface of the second layer of interlayer dielectric 414. The thickness of etch stop layer 416 is typically in the range of 500–1000 Å. Etch stop layer 416 is typically formed of a nitride material such as silicon oxynitride (SiON) or silicon nitride ($Si_3N_4$). A third layer of interlayer dielectric 418 is formed on the surface of etch stop layer 416.

The surface of the third layer of interlayer dielectric 418 is planarized and etch stop layer 420 is formed on the planarized surface of the interlayer dielectric 418. The thickness of etch stop layer 420 is in the range of 1000–1500 Å and is formed of TaN, SiON or $Si_3N_4$.

A layer of photoresist 422 is formed on the surface of etch stop layer 420.

FIG. 4B shows the partially completed semiconductor device 400 as shown in FIG. 4A with the layer of photoresist 422 etched. All etch processes discussed are anisotropic etch processes, that is, the etch processes are directional as opposed to isotropic etch processes that etch in all directions. In should be understood that when discussing the process of etching photoresist, the process is a well-known process including exposing the photoresist and removing the exposed photoresist typically by a chemical wash. The dimensions of the etched portions of the layer of photoresist 422 coincides with the original via width $W_1$ as indicated by dashed lines 424.

FIG. 4C shows the partially completed semiconductor device 400 as shown in FIG. 4B with the exposed portion of etch stop layer 420 etched by an anisotropic etch process. The anisotropic etch process used to etch the etch stop layer 420 is tool dependent and the selection of the appropriate process is within the skill of a person of ordinary skill in the art. The etch process is selected to selectively etch only the etch stop layer 420. Any of the well known etch process can be used.

FIG. 4D shows the partially completed semiconductor device 400 as shown in FIG. 4C with the remaining portions of the layer of photoresist 422 removed. The process of removing photoresist is well known in the semiconductor manufacturing art and any well-known process can be used.

FIG. 4E shows the partially completed semiconductor device 400 as shown in FIG. 4D with a second layer of photoresist 426 formed on the surface of the semiconductor device 400. The dashed lines 428 indicate the dimensions of the trench 408 including the width $W_2$.

FIG. 4F shows the partially completed semiconductor device 400 as shown in FIG. 4E with the second layer of photoresist 426 etched with dimensions coinciding with the dimensions of the trench 408. The photoresist is shown removed down to the interlayer dielectric 418 and down to the exposed surface of the layer of etch stop 420.

FIG. 4G shows the partially completed semiconductor device 400 as shown in FIG. 4F with the exposed portion of interlayer dielectric 418 etched by an anisotropic process down to the etch stop layer 416. The etch process selected to etch the interlayer dielectric 418 is a selective etch process that is intended to etch only the material in the interlayer dielectric 418. The appropriate etch process is tool dependent and is within the skill of a person or ordinary skill in the semiconductor manufacturing art Note that even though the etch process to etch the interlayer dielectric is selective, the layer of photoresist 426 is partially consumed by the etch process.

FIG. 4H shows the partially completed semiconductor device 400 as shown in FIG. 4G with the exposed portion of etch stop layers 416 and 420 removed by an anisotropic etch process. The etch process is a selective etch process that is intended to etch only etch stop layers 416 and 420. In the event that etch stop layers 416 and 420 are formed of different materials, it may be necessary to do two selective separate etch processes, one to selectively etch the etch stop layer 416 and another to selectively etch the etch stop layer 420. The selection of the appropriate selective etch processes is within the skill of a person of ordinary skill in the art.

FIG. 4I shows the partially completed semiconductor device 400 as shown in FIG. 4H with the remaining portion of the layer of photoresist 426 removed.

Figure 4L:
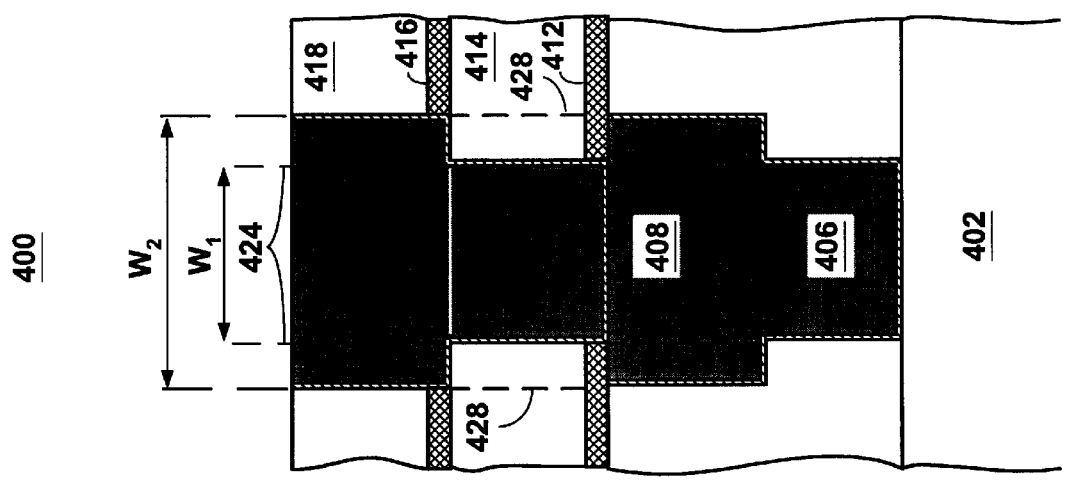
FIG. 4L shows the partially completed semiconductor device shown in FIG. 4K with a barrier layer formed on the surfaces of the trench and via and the trench and via filled with a conductive material.
Figure 4K:
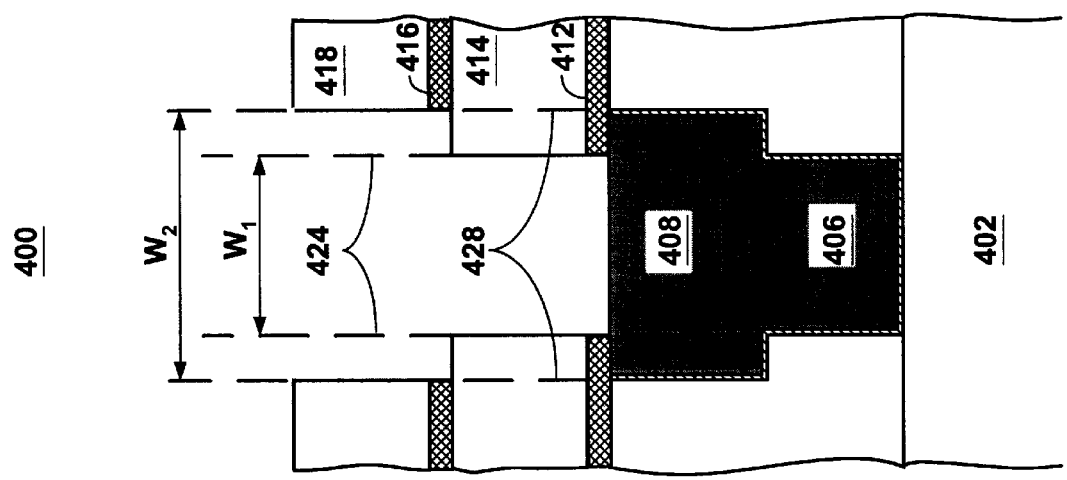
FIG. 4K shows the partially completed semiconductor device shown in FIG. 4J with the exposed seal layers etched.
Figure 4J:
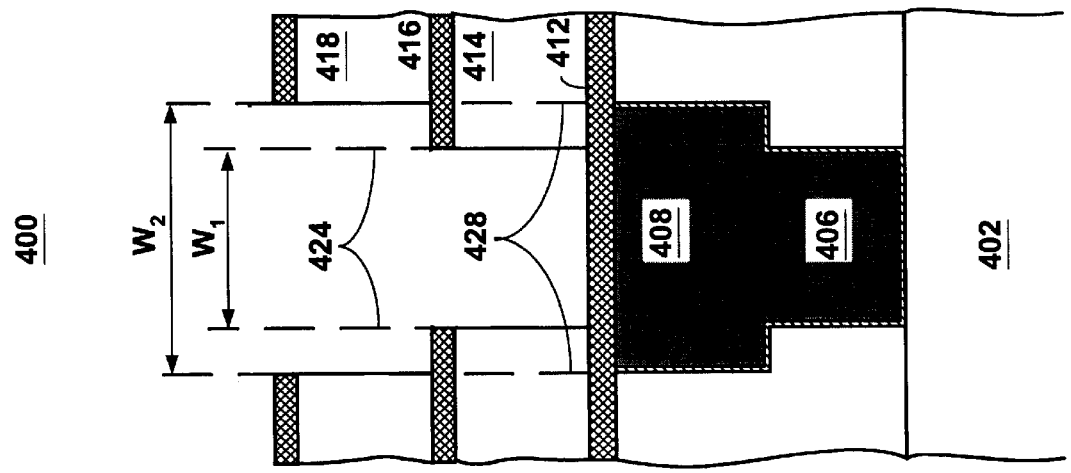
FIG. 4J shows the partially completed semiconductor device shown in FIG. 4I with the exposed portion of the third layer of interlayer dielectric etched to the second seal layer and the exposed portion of the second layer of interlayer dielectric etched to the first seal layer.

FIG. 4J shows the partially completed semiconductor device 400 as shown in FIG. 4I with the interlayer dielectric 414 etched down to etch stop layer 412 by an anisotropic process. The etch process is a selective etch process that is intended to etch only the interlayer dielectric 414. The selection of the appropriate selective etch process is within the skill of a person of ordinary skill in the art.

FIG. 4K shows the partially completed semiconductor device 400 as shown in FIG. 4J with the exposed portions of etch stop layers 420, 416 and 412 removed by an anisotropic process. The etch process to etch stop layers 420, 416 and 412 may be a single etch process if the etch stop layers 420, 416 and 412 are of the same material. In the event the etch stop layers are made of different materials, it may be necessary to perform more than a single selective etch process.

FIG. 4L shows the partially completed semiconductor device 400 as shown in FIG. 4K with a barrier layer 430 formed on the surfaces of the etched portions of interlayer dielectric layers 418 and 414 and the etched portions filled with a conductive material such as tungsten, copper or doped polysilicon. The top surfaces of interlayer dielectric layer 418 and conductive material in the etched portion of the interlayer dielectric layer 418 are planarized. As shown, the dimension $W_2$ of the trench 432 is the same as the dimension of the trench 408 as indicated by the dashed lines 428.

In summary, the results and advantages of the method of the present invention can now be more fully realized. The method of the present invention provides a semiconductor device having multiple dual damascene structures that maintain the minimum dimension and provide full contact areas between conductive layers. The full contact area between conductive layers results in the minimum resistance for the contacts between layers. The maintenance of the minimum dimensions provides the maximum density for the semiconductor device.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device, the method comprising:

forming a first layer of interlayer dielectric on a surface of a semiconductor substrate that contains active semiconductor devices;

forming a first via having a width $W_1$ in the first layer of interlayer dielectric;

forming a first trench having a width $W_2$ in the first layer of interlayer dielectric wherein the first via and the first trench form a first dual damnascene structure;

planarizing a surface of the first layer of interlayer dielectric and forming a first etch stop layer on the planarized surface of the first layer of interlayer dielectric;

forming a second layer of interlayer dielectric on a surface of the first etch stop layer;

planarizing a surface of the second layer of interlayer dielectric and forming a second etch stop layer on the planarized surface of the second layer of interlayer dielectric;

forming a third layer of interlayer dielectric on a surface of the second etch stop layer;

planarizing a surface of the third layer of interlayer dielectric and forming a third etch stop layer on the planarized surface of the third interlayer dielectric;

forming a first layer of photoresist on a surface of the third etch stop layer and etching the first layer of photoresist with a pattern having a width dimension of $W_1$;

selectively etching a portion of the third etch stop layer exposed by the step of etching the first layer of photoresist, wherein the portion of the third etch stop layer is etched down to the planarized surface of the third layer of interlayer dielectric;

removing the first layer of photoresist and forming a second layer of photoresist on the semiconductor device and etching the second layer of photoresist with a pattern having a width dimension of $W_2$ exposing a portion of the third etch stop layer and a portion of the third layer of interlayer dielectric;

selectively etching the portion of the third layer of interlayer dielectric down to the second etch stop layer, wherein a portion of the second etch stop layer is exposed;

selectively etching the exposed portion of the second etch stop layer down to the second layer of interlayer dielectric, wherein a portion of the second layer of interlayer dielectric is exposed;

selectively etching the portion of the second layer of interlayer dielectric down to the first etch stop layer, wherein a portion of the first etch stop layer is exposed; and selectively etching the exposed portion of the first etch stop layer, selectively etching the exposed portion of the second etch stop layer and selectively etching the exposed portion of the third etch stop layer.

2. The method of claim 1 further comprising forming a barrier layer on walls formed by etching the first etch stop layer, the second interlayer dielectric, the second etch stop layer and the third interlayer dielectric.

3. The method of claim 2 further comprising filling the etched portions of the first etch stop layer, the second interlayer dielectric, the second etch stop layer and the third interlayer dielectric with a conductive material wherein a second dual damascene structure is formed and wherein the second dual damascene structure is in contact with the first dual damascene structure.

4. The method of claim 3 wherein the conductive material is selected from the group consisting of aluminum, tungsten and copper.

5. The method of claim 4 wherein the etch stop layers are formed from a material selected from the group consisting of SiON, $Si_3N_4$ and TaN.

* * * * *